(12) United States Patent
Schapendonk et al.

(10) Patent No.: US 8,085,651 B2
(45) Date of Patent: Dec. 27, 2011

(54) SIGNAL PROCESSOR HAVING A SAMPLING ARRANGEMENT

(75) Inventors: Edwin Schapendonk, Oss (NL); Jan Hendrik Haanstra, Nijmegen (NL); Willebrordus Gerardus Traa, St. Oedenrode (NL)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 701 days.

(21) Appl. No.: 11/995,601

(22) PCT Filed: Jul. 13, 2006

(86) PCT No.: PCT/IB2006/052384
§ 371 (c)(1),
(2), (4) Date: Nov. 14, 2008

(87) PCT Pub. No.: WO2007/010456
PCT Pub. Date: Jan. 25, 2007

(65) Prior Publication Data
US 2009/0116373 A1    May 7, 2009

(30) Foreign Application Priority Data
Jul. 15, 2005    (EP) .................................... 05106525

(51) Int. Cl.
*H04J 1/12*    (2006.01)

(52) U.S. Cl. ........................................................ 370/201
(58) Field of Classification Search .................. 370/201, 370/236, 252, 286, 410, 496, 503, 535, 505
See application file for complete search history.

(56) References Cited

U.S. PATENT DOCUMENTS

| 5,333,060 A * | 7/1994 | Yun ................................ 386/311 |
| 6,233,295 B1 | 5/2001 | Wang |
| 7,752,477 B2 * | 7/2010 | Otomo ........................... 713/401 |

FOREIGN PATENT DOCUMENTS

| CN | 1285995 | 2/2001 |
| WO | 03055207 A1 | 7/2003 |

* cited by examiner

*Primary Examiner* — Chi Pham
*Assistant Examiner* — Alexander Boakye
(74) *Attorney, Agent, or Firm* — DLA Piper LLP (US)

(57) ABSTRACT

In a signal processor, a sampling arrangement (SH11, S12, SH13, ADC1) samples at least a first signal (YA) and a second signal (UA, VA) so as to obtain sampled first signal (YD1) and a sampled second signal (UD1, VD1), respectively. A folding compensator (LPF11, LPF12, LPF13, SUB11, SUB12, MUX12) compensates for a folding component in the sampled first signal (YD1) on the basis of a spectral portion of the sampled second signal (UD1, VD1) that is substantially free of components that originate from the second signal (UA, VA).

11 Claims, 4 Drawing Sheets

SIGNAL PROCESSOR HAVING A SAMPLING ARRANGEMENT

PRIORITY CLAIMS/RELATED APPLICATIONS

This application is a 371 U.S. national stage filing of (and claims the benefit and priority to under 35 U.S.C. 119 and 120) PCT/IB06/52384 filed on Jul. 13, 2006, which in turn claims the benefit of and priority under 35 U.S.C. 119 to European Patent Application Serial No. 05106525.8 filed on Jul. 15, 2005, both of which are incorporated herein by reference.

FIELD OF THE INVENTION

An aspect of the invention relates to a signal processor that comprises a sampling arrangement, which samples at least a first signal and a second signal. The signal processor may be, for example, a video processor that processes a video input signal that is to be displayed. In that case, a luminance signal may constitute the first signal. A chrominance signal may constitute the second signal. Other aspects of the invention relate to a method of signal processing, a computer program product for a signal processor, and an information-rendering system.

BACKGROUND OF THE INVENTION

WO 03/055207 describes that time sharing an analog-to-digital converter for multiple input signals is a well-known way to reduce the number of analog-to-digital converters in a video and/or audio system. One technique for sharing an analog-to-digital converter in such systems involves multiplexing. A multiplexer simultaneously receives analog U and V input signals, and is switched in dependence upon an enable signal to output selected ones of the received analog U and V signals in an alternating manner. An analog-to-digital converter receives the analog U and V output signals from the multiplexer and digitizes the received U and V signals in dependence upon a clock signal, wherein each interval of the clock signal defines a single clock cycle or time interval. The frequency of the clock signal may be two times the frequency of the enable signal. A demultiplexer receives the digital U and V signals from the analog-to-digital converter, and is switched in dependence upon the enable signal two output the digital U and V signals.

SUMMARY OF THE INVENTION

It is an object of the invention to provide an improved signal processing. The invention is defined by the independent claims. The dependent claims define advantageous embodiments.

According to an aspect of the invention, a signal processor has the following characteristics. A sampling arrangement samples a first signal and a second signal so as to obtain sampled first signal and a sampled second signal, respectively. A folding compensator compensates for a folding component in the sampled first signal on the basis of a spectral portion of the sampled second signal that is substantially free of components that originate from the second signal.

The invention takes the following aspects into consideration. Signal sampling is accompanied with a so-called folding effect. The folding effect occurs in the frequency domain. Let it be assumed that a signal, which has a given bandwidth, is sampled with a given effective sampling frequency so as to obtain a sampled signal. The sampled signal will comprise various spectral components that originate from a single spectral component in the signal that is sampled. That is, sampling introduces additional spectral components, which are commonly referred to as folding components.

A folding component has a frequency that depends on the effective sampling frequency. In general, the effective sampling frequency is at least twice the bandwidth of the signal that is sampled. This prevents folding components from occurring within the bandwidth of the signal, which would otherwise cause distortion. In addition, the signal is filtered before the signal is sampled so as to prevent that other signals produce folding components. Such filtering is commonly referred to as anti-aliasing filtering.

Anti-aliasing filtering may not always be sufficient to prevent other signals from producing folding components. This is particularly true for signal processing applications in which various different circuits, which carry out various different processes, are relatively close to each other because these circuits forms part of an integrated circuit or a micro module. A crosstalk of a signal from one circuit to another circuit may cause a parasitic signal within that other circuit. Such a crosstalk is difficult to avoid when the circuits are relatively close to each other. In general, it will be difficult, or even impossible, to remove a parasitic signal, which is due to crosstalk, by means of, for example, filtering.

Let it be assumed that a first signal is sampled in conjunction with a parasitic signal and that a second signal is sampled in conjunction with a similar parasitic signal. Such a case may occur in many practical implementations, for example, due to a crosstalk as explained hereinbefore. A sampled first signal and a sampled second signal will be obtained that each comprise a direct representation of the parasitic signal and folding components, which are indirect representations of the parasitic signal. A folding component in the sampled first signal may coincide with spectral components that originate from the first signal. In that case, it is not possible to distinguish the folding component from these spectral components. However, in the sampled second signal, the folding components and the direct representation of the parasitic signal may each fall within a spectral portion that is substantially free of components that originate from the second signal. The folding components and the direct representation of the parasitic signal can then be distinguished from the spectral components that originate from the second signal.

In accordance with the aforementioned aspect of the invention, a folding component in the sampled first signal is compensated for on the basis of a spectral portion of the sampled second signal that is substantially free of components that originate from the second signal.

In a certain sense, the aforementioned spectral portion of the sampled second signal can provide information about a folding component in the sampled first signal. This information is used, as it were, to provide compensation for that folding component. Accordingly, the invention allows compensation for a folding component which would otherwise be difficult to suppress by means of, for example, anti-aliasing filtering. For those reasons the invention allows a relatively good quality of signal processing.

Another advantage of the invention relates to the following aspects. In principle, it is possible to prevent signal distortion due to the folding effect by increasing the effective sampling frequency. However, increasing the effective sampling frequency generally entails higher power consumption or requires faster circuits, which are more expensive, or both. It has been explained hereinbefore that the invention allows compensation for a folding component. Consequently, the invention allows distortion-free operation at a relatively low effective sampling frequency. For those reasons, the invention allows power-efficient and cost-efficient implementations.

Yet another advantage of the invention relates to the following aspects. A crosstalk will generally occur when a great variety of various different circuits, which carry out various different processes, are implemented on a single semiconductor chip or in a single micro module. The invention allows compensating for a folding component that is due to a crosstalk, against which anti-aliasing filtering is less effective as explained hereinbefore. Consequently, the invention allows a relatively good signal processing quality even if there is a crosstalk, such as in integrated-circuit implementations. For example, a video processor, an audio processor, and a controller, if necessary, can be implemented on a single semiconductor chip with each of these processors providing a relatively good signal processing quality. For those reasons, the invention allows integrated-circuit implementations that provide a relatively good signal processing quality.

These and other aspects of the invention will be described in greater detail hereinafter with reference to drawings.

DETAILED DESCRIPTION

Figure 1:
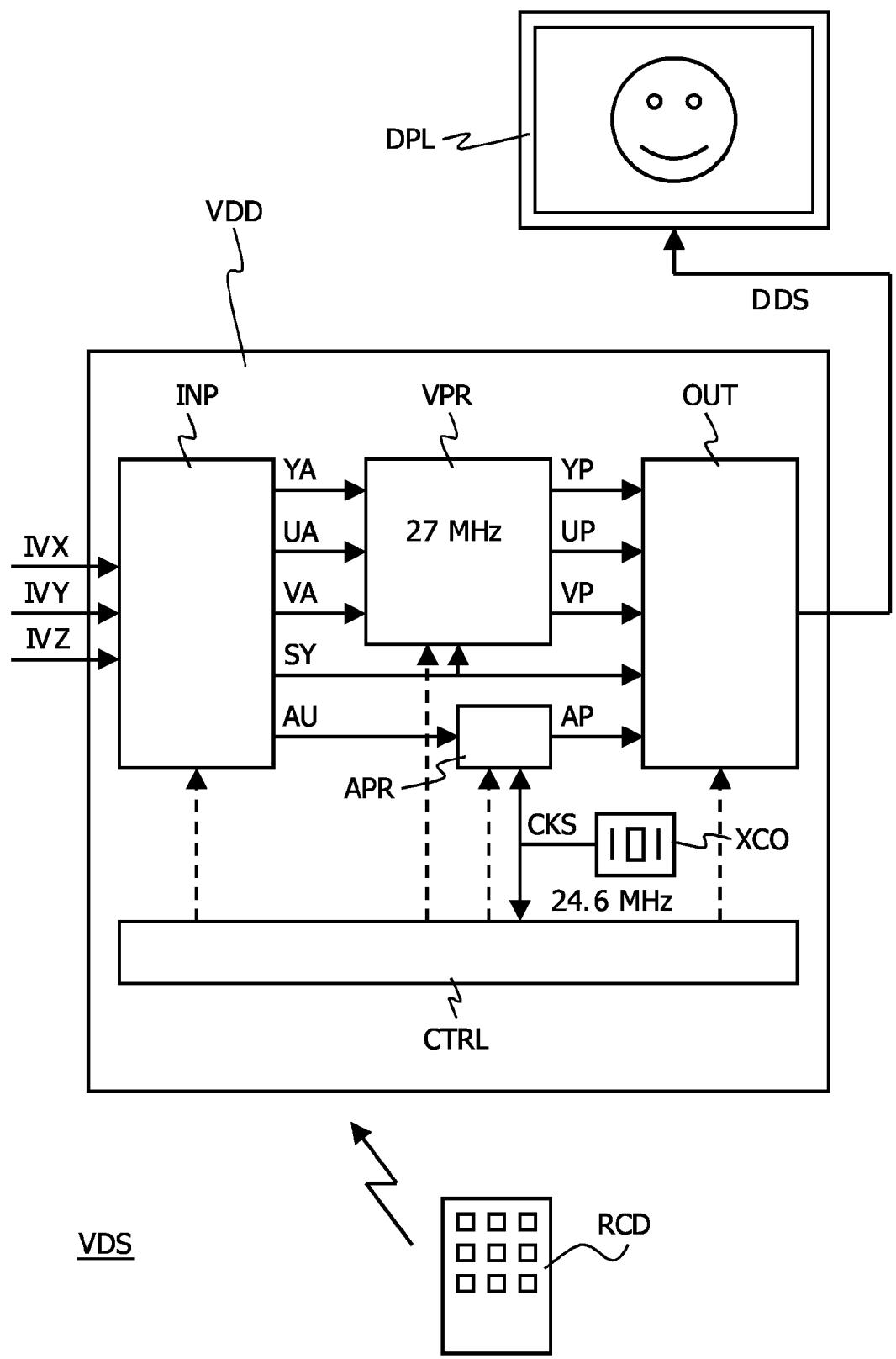
FIG. 1 is a block diagram that illustrates a video display set, which comprises a video processor.

FIG. 1 illustrates a video display set VDS. The video display set VDS comprises a video display driver VDD, a display device DPL, and a remote control device RCD. The video display driver VDD comprises an input circuit INP, a video processor VPR, an audio processor APR, an output circuit OUT, a crystal oscillator XCO, and a controller CTRL. The video display driver VDD receives various input video signals IVX, IVY, IVZ from various video sources, which are not shown. The display device DPL may be, for example, a flat panel display of the liquid crystal type.

The video display driver VDD basically operates as follows. Let it be assumed that a user selects a particular video source on his or her remote control device RCD. The remote control device RCD sends a command to the controller CTRL that indicates the particular video source to be selected. In response, the controller CTRL causes the input circuit INP to select that particular video source.

The input circuit INP derives a set of signals from the input video signal of the video source that the user has selected. The set of signals comprises an analog luminance signal YA, an analog first chrominance signal UA, and an analog second chrominance signal VA. These signals represent video information and will collectively be referred to as analog video signals YA, UA, VA hereinafter. The set of signals further comprises a synchronization signal SY and an audio signal AU. The synchronization signal SY may comprise various components, such as, for example, a horizontal synchronization component and a vertical synchronization component.

The analog luminance signal YA has a relatively large bandwidth, which is typically 5 MHz. The analog luminance signal YA may comprise spectral components in a frequency band that ranges from 0 to 5 MHz. The analog first and second chrominance signals UA, VA, have a relatively narrow bandwidth, which is typically 1.5 MHz. The first and second chrominance signals UA, VA may comprise spectral components in a frequency band that ranges from 0 to 1.5 MHz.

The video processor VPR converts the analog video signals YA, UA, VA into digital video signals, which have a sample frequency of, for example, 27 MHz. Subsequently, the video processor VPR processes these digital video signals so as to provide various video features, such as, for example, double window, picture-in-picture and panorama view. The video processor VPR may also enhance various display characteristics, such as, for example, sharpness, brightness, and contrast. The user may select a video feature and adjust one or more display characteristics by means of the remote control device RCD. The video processor VPR applies processed video signals YP, UP, VP to the output circuit OUT. The audio processor APR processes the audio signal AU, which the input circuit INP provides, so as to obtain a processed audio signal AP, which the output circuit OUT receives.

The output circuit OUT provides a display driver signal DDS in response to the processed video signals YP, UP, VP, the synchronization signal SY, and the processed audio signal AP. To that end, the output circuit OUT may carry out various signal processing operations, such as, for example, amplification, level shifting, bias voltage generation, and synchronization. The display device DPL, which receives the display driver signal DDS, displays the input video signal that the user has selected. The display device DPL may furthermore produce a sound, which is comprised in the input video signal.

The crystal oscillator XCO generates a system clock signal CKS, which has a frequency of 24.6 MHz. The audio processor APR and the controller CTRL receive the system clock signal CKS. The system clock signal CKS defines discrete instants when switching elements that form part of the audio processor APR or the controller CTRL may change state.

Figure 2:
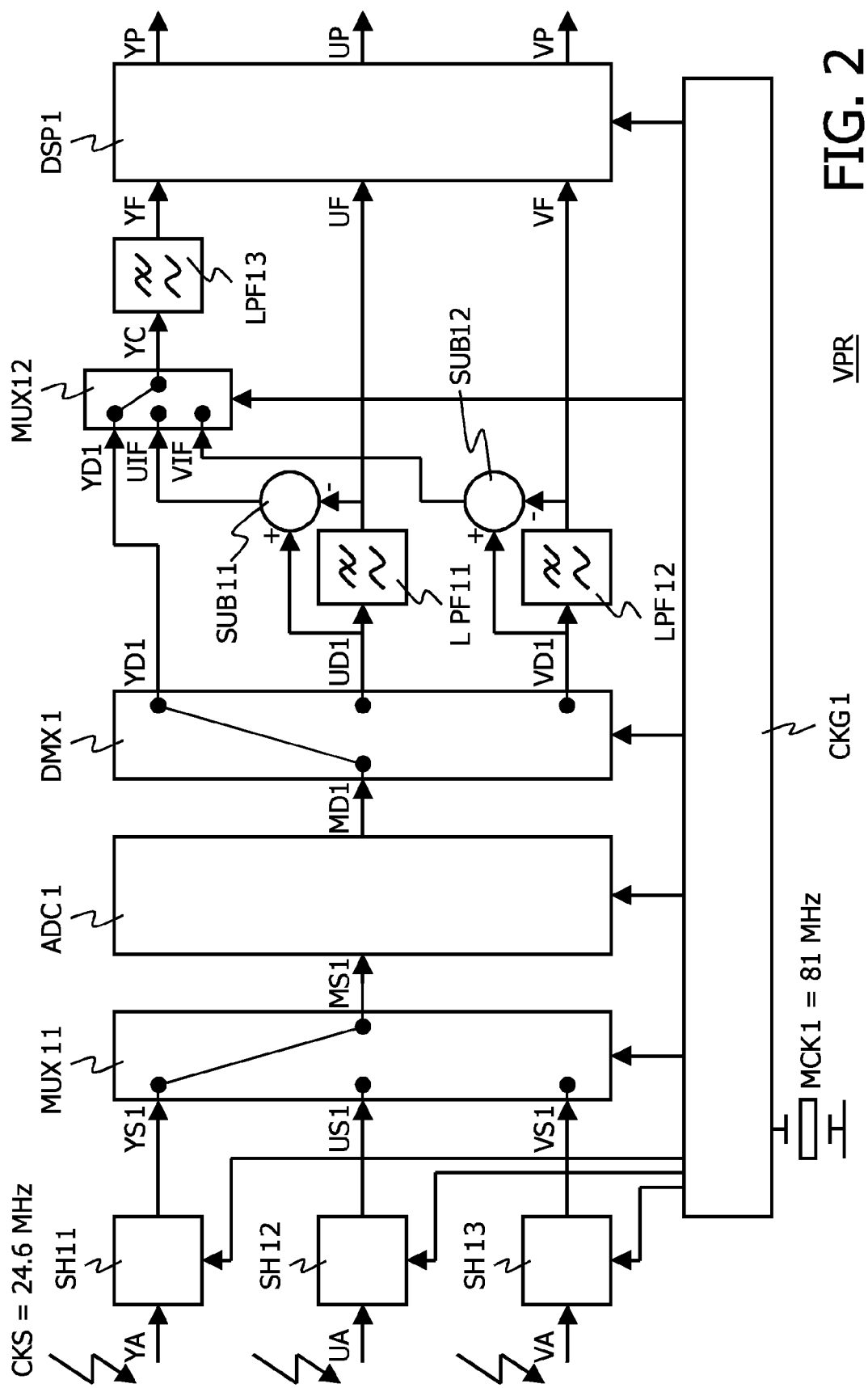
FIG. 2 is a block diagram that illustrates a first implementation of the video processor.

FIG. 2 illustrates a first implementation of the video processor VPR, which will be referred to as first video processor implementation hereinafter. The first video processor implementation comprises three sample-and-hold circuits SH11, SH12, SH13, one for each of the analog video signals YA, UA, VA, respectively. The first video processor implementation further comprises two multiplexers MUX11, MUX12, an analog-to-digital converter ADC1, a demultiplexer DMX1, a digital signal processor DSP1, and a clock generator CKG1. The first video processor implementation further comprises three low pass filters LPF11, LPF12, LPF13 and two subtractors SUB11, SUB12. The first video processor implementation may further comprise delay circuits, which are not shown, that compensate for any filter delays.

The first video processor implementation operates as follows. The three sample-and-hold circuits SH11, SH12, SH13 sample the analog video signals YA, UA, VA, respectively. The clock generator CKG1 defines respective instants when the three sample-and-hold circuits SH11, SH12, SH13 take samples. The clock generator CKG1 defines these respective instants on the basis of a master clock signal MCK1, which has a frequency of 81 MHz. A sample of one of the analog video signals YA, UA, VA is taken during a clock cycle of the master clock signal MCK1.

Figure 3:
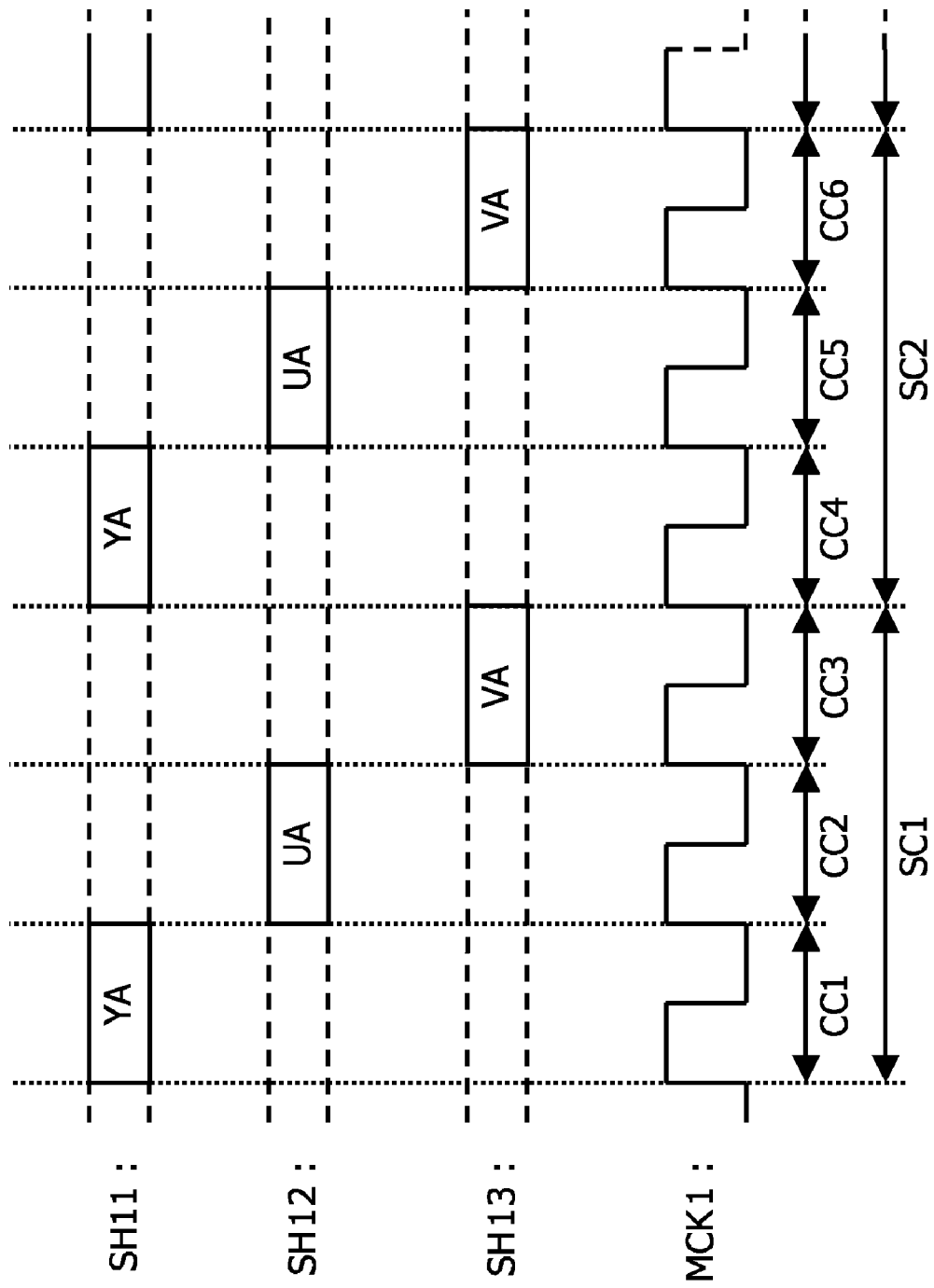
FIG. 3 is a time diagram that illustrates sampling operations that take place within the first implementation of the video processor.

FIG. 3 illustrates that the three sample-and-hold circuits SH11, SH12, SH13 sample the analog video signals YA, UA, VA, respectively, one-by-one in a cyclic fashion. FIG. 3 illustrates two consecutive sampling cycles SC1, SC2. Sampling cycle SC1 comprises clock cycles CC1, CC2, CC3 of the master clock signal MCK1. Sampling cycle SC2 comprises clock cycles CC4, CC5, CC6 of the master clock signal MCK1.

In sampling cycle SC1, sample-and-hold circuit SH1 takes a sample from the analog luminance signal YA in clock cycle CC1, which is the first clock cycle within sampling cycle SC1. Sample-and-hold circuit SH2 takes a sample from the first chrominance signal UA in clock cycle CC2, which is the second clock cycle within sampling cycle SC1. Sample-and-hold circuit SH3 takes a sample from the second chrominance signal VA in clock cycle CC3, which is the third clock cycle within sampling cycle SC1. Sampling cycle SC1 is followed by sampling cycle SC2, in which the three sample-and-hold circuits SH11, SH12, SH13 sample the analog video signals YA, UA, VA in an identical fashion. The same holds for each subsequent sampling cycle.

Sample-and-hold circuit SH11 has an effective sampling frequency of 27 MHz, which is equal to 81 MHz divided by 3. This is because sample-and-hold circuit SH11 takes a sample of the analog luminance signal YA every three consecutive clock cycles of the master clock signal MCK1. The same applies to sample-and-hold circuits SH12 and SH13. The three sample-and-hold circuits SH11, SH12, SH13 have the same effective sampling frequency, which is 27 MHz, but different sampling phases. FIG. 3 illustrates this.

FIG. 2 illustrates that the analog luminance signal YA, which sample-and-hold circuit SH11 receives, may comprise a parasitic component that is due to a crosstalk of the system clock signal CKS. Sample-and-hold circuit SH11 will sample this parasitic component. Accordingly, sample-and-hold circuit SH11 will produce a stream of analog luminance samples YS1 that comprises a folding component. The folding component has a frequency of 2.4 MHz, which is the difference between the frequency of the system clock signal CKS, which is 24.6 MHz, and the effective sampling frequency, which is 27 MHz for each of the three sample-and-hold circuits SH11, SH12, SH13.

The analog first chrominance signal UA also comprises a parasitic component that is due to a crosstalk of the system clock signal CKS. The same holds for the analog second chrominance signal VA. The respective parasitic components will generally be similar, in particular if the three sample-and-hold circuits SH11, SH12, SH13 receive the analog video signals YA, UA, VA, respectively, via similar signal paths, which are physically close to each other. Sample-and-hold circuits SH12 and SH13 will produce a stream of analog first chrominance samples US1 and a stream of analog second chrominance samples VS1, respectively, each of which comprises a folding component that has a frequency of 2.4 MHz.

Multiplexer MUX11 multiplexes the stream of analog luminance samples YS1, the stream of analog first chrominance samples US1, and the stream of analog second chrominance samples VS1. To that end, multiplexer MUX11 takes respective samples from the aforementioned streams, one-by-one in a cyclic fashion, comparable with what FIG. 3 illustrates. That is, multiplexer MUX11 has switch cycles comparable with the sampling cycles described hereinbefore. A switch cycle comprises three consecutive clock cycles of the master clock signal MCK1. In the first clock cycle of a switch cycle, multiplexer MUX11 takes an analog luminance sample. In the second clock cycle, multiplexer MUX11 takes an analog first chrominance sample. In the third clock cycle, multiplexer MUX11 takes an analog second chrominance sample. The analog-to-digital converter ADC1 thus receives a stream of multiplexed analog samples MS1.

The analog-to-digital converter ADC1 establishes a binary value for each analog sample in the stream of multiplexed analog samples MS1. The binary value reflects the magnitude of the analog sample concerned. Accordingly, the analog-to-digital converter ADC1 provides a stream of multiplexed digital samples MD1 in the form of a stream of binary values. The stream of multiplexed digital samples MD1 comprises digital luminance samples, digital first chrominance samples, and digital second chrominance samples. The aforementioned digital samples are multiplexed in a fashion comparable with what FIG. 3 illustrates. In a time interval of three consecutive clock cycles, there is one digital luminance sample, one digital first chrominance sample, and one digital second chrominance sample.

The demultiplexer DMX1 splits the stream of multiplexed digital samples MD1 into a stream of digital luminance samples YD1, a stream of first chrominance samples UD1, and a stream of second chrominance samples VD1. To that end, the demultiplexer DMX1 has switch cycles comparable with those of multiplexer MUX11. Accordingly, in a time interval of three consecutive master clock cycles, the demultiplexer DMX1 takes a digital luminance sample, a digital first chrominance sample, and a digital second chrominance sample from the stream of multiplexed digital samples MD1. The demultiplexer DMX1 assigns these respective samples to the stream of digital luminance samples YD1, the stream of digital first chrominance samples UD1, and the stream of digital second chrominance samples VD1, respectively.

The stream of digital luminance samples YD1 will comprise a folding component. This folding component is, at least partially, a digital version of the folding component in the stream of analog luminance samples YS1. Similarly, the stream of digital first chrominance samples UD1 and the stream of digital second chrominance samples VD1 will each comprise a folding component. Each of these folding components is, at least partially, a digital version of the folding component in the stream of analog first chrominance samples US1 and the stream of analog second chrominance samples VS1, respectively. The respective folding components in the respective streams of digital samples YD1, UD1, VD1 have a frequency of 2.4 MHz.

It should be noted that the respective folding components in the respective streams of digital samples YD1, UD1, VD1 may, at least partially, also be due to a crosstalk of the system clock signal CKS to a signal path between the three sample-and-hold circuits SH11, SH12, SH13 and the analog-to-digital converter ADC1. As explained hereinbefore, the analog-to-digital converter ADC1 operates in a time discrete fashion: the analog-to-digital converter establishes respective binary values for respective analog samples in respective clock cycles of the master clock signal MCK1. This constitutes a sampling operation. A crosstalk of the system clock signal CKS may add a parasitic component, which has a frequency of 24.6 MHz, to the stream of multiplexed analog samples MS1. The analog-to-digital converter ADC1 will effectively sample this parasitic component. As a result, the aforementioned crosstalk will, at least partially, cause the respective folding components in the respective streams of digital samples YD1, UD1, VD1.

Low pass filter LPF11 filters the stream of digital first chrominance samples UD1. Low pass filter LP11 has a cutoff frequency of approximately 1.5 MHz. Consequently, low pass filter LPF11 suppresses the folding component, which is present in the stream of digital first chrominance samples UD1. Low pass filter LPF11 provides a filtered stream of digital first chrominance samples UF, in which the folding component is substantially absent. Low pass filter LPF12 filters the stream of digital second chrominance samples VD1. Low pass filter LPF12 equally has a cutoff frequency of approximately 1.5 MHz. As a result, low pass filter LPF12 provides a filtered stream of digital second chrominance samples VF, in which the folding component is substantially absent.

Subtractor SUB11 subtracts the filtered stream of digital first chrominance samples UF from the stream of digital first chrominance samples UD1. Accordingly, an inversely filtered stream of digital first chrominance samples UIF is obtained. The inversely filtered stream of digital first chrominance samples UIF corresponds with what would have been obtained if the stream of digital first chrominance samples UD1 were applied to a high pass filter having a cutoff frequency of 1.5 MHz. The inversely filtered stream of digital first chrominance samples UIF comprises the folding component, which is present in the stream of digital first chrominance samples UD1. Subtractor SUB12 provides an inversely filtered stream of digital second chrominance samples VIF by subtracting the filtered stream of digital second chrominance samples VF from the stream of digital second chrominance samples VD1. The inversely filtered stream of second digital chrominance samples VIF comprises the folding component, which is present in the stream of digital second chrominance samples VD1.

Multiplexer MUX12 multiplexes the stream of digital luminance samples YD1, the inversely filtered stream of digital first chrominance samples UIF and the inversely filtered stream of digital second chrominance samples VIF. Multiplexer MUX12 has switch cycles comparable with those of multiplexer MUX11. In a time interval of three consecutive clock cycles of the master clock signal MCK1, multiplexer MUX12 takes one sample from the stream of digital luminance samples YD1, one sample from the inversely filtered stream of digital first chrominance samples UIF, and one sample from the inversely filtered stream of second chrominance samples VIF. Multiplexer MUX12 provides a multiplex of the aforementioned streams of digital samples that constitutes a complemented stream of digital luminance samples YC.

Low pass filters LPF11, LPF12, the two subtractors SUB11, SUB12 and multiplexer MUX12 provide compensation for the folding component that is present in the stream of digital luminance samples YD1. This can be understood by means of the following example.

Let it be assumed that the three sample-and-hold circuits SH11, SH12, SH13 do not receive the analog video signals YA, UA, VA. Nonetheless, the three sample-and-hold circuits SH11, SH12, SH13 will each receive a parasitic signal, which is due to the crosstalk of the system clock signal CKS as mentioned hereinbefore. Let it further be assumed that the respective parasitic signals are identical, which assumption is quite correct in many practical implementations. The three sample-and-hold circuits SH11, SH12, SH13 receive the same parasitic signal.

In that case, the complemented stream of digital luminance samples YC, which multiplexer MUX12 provides, corresponds with a stream of digital samples that an analog-to-digital converter having a sampling frequency of 81 MHz will provide in response to the same parasitic signal. In effect, as far as the parasitic signal is concerned, the three sample-and-hold circuits SH11, SH12, SH13 are functionally equivalent to a single sample-and-hold circuit that has a sampling frequency of 81 MHz.

Consequently, the complemented stream of digital luminance samples YC will not comprise any 2.4 MHz folding component if the three sample-and-hold circuits SH11, SH12, SH13 indeed receive exactly the same parasitic signal, which is an ideal case. In practice, there may be some difference between respective parasitic signals in the analog video signals YA, UA, VA. In that case, a 2.4 MHz folding component will be present in the complemented stream of digital luminance samples YC. However, this 2.4 MHz folding component will have a relatively small magnitude compared with the respective 2.4 MHz folding components in the respective streams of digital samples YD1, UD1, VD1.

Let it now be assumed that there is only a crosstalk of the system clock signal CKS to a signal path between multiplexer MUX11 and the analog-to-digital converter ADC1. It has been explained hereinbefore that such a crosstalk will also cause a 2.4 MHz folding component in each of the respective streams of digital samples YD1, UD1, VD1. These respective 2.4 MHz folding components originate from the same 24.6 MHz parasitic signal on the stream of multiplexed analog samples MS1. Consequently, the complemented stream of digital luminance samples YC corresponds with a stream of digital samples that an analog-to-digital converter having a sampling frequency of 81 MHz will provide in response to this 24.6 MHz parasitic signal. The complemented stream of digital luminance samples YC will therefore not comprise any 2.4 MHz folding component.

The complemented stream of digital luminance samples YC will comprise a parasitic component, which has a frequency of 24.6 MHz. This 24.6 MHz parasitic component is a digital representation of various parasitic signals, which are due to crosstalk of the system clock signal CKS. The 24.6 MHz parasitic component is well outside the bandwidth of the analog luminance signal, which ranges from 0 to 5 MHz. It should be noted that the complemented stream of digital luminance samples YC will further comprise a folding component that has a frequency of 56.4 MHz, which is the difference between the sample frequency of 81 MHz and the frequency of the system clock signal CKS, which is 24.6 MHz.

Low pass filter LPF13 filters the complemented stream of digital luminance samples YC. Low pass filter LPF13 has a cutoff frequency of 5 MHz. Consequently, low pass filter LPF13 suppresses the 24.6 MHz parasitic component and the 56.4 MHz folding component, which are present in the complemented stream of digital luminance samples YC. Accordingly, low pass filter LPF13 provides a filtered stream of digital luminance samples YF that is substantially free of any parasitic or folding component due to the crosstalk of the system clock signal CKS.

The digital signal processor DSP processes the filtered stream of digital luminance samples YF, the filtered stream of digital first chrominance samples UF, and the filtered stream of digital first chrominance samples VF. This processing allows various video features, such as, for example, double window, picture-in-picture and panorama view, as well as enhancement of various display characteristics, such as, for example, sharpness, brightness The digital signal processor DSP provides the processed video signals YP, UP, VP, which are also illustrated in FIG. 1.

The digital signal processor DSP may comprise one or more decimators for sample rate reduction. For example, the filtered stream of digital luminance samples YF will have a sample rate of 81 megasamples per second. This stream has a signal bandwidth of 5 MHz. Low pass filter LPF13 suppresses spectral components that are outside the signal bandwidth. Consequently, the sample rate can be reduced without this causing signal distortion due to the folding effect. The filtered stream of digital first chrominance samples UF and the filtered stream of digital first chrominance samples VF may also undergo sample rate reduction for similar reasons.

Figure 4:
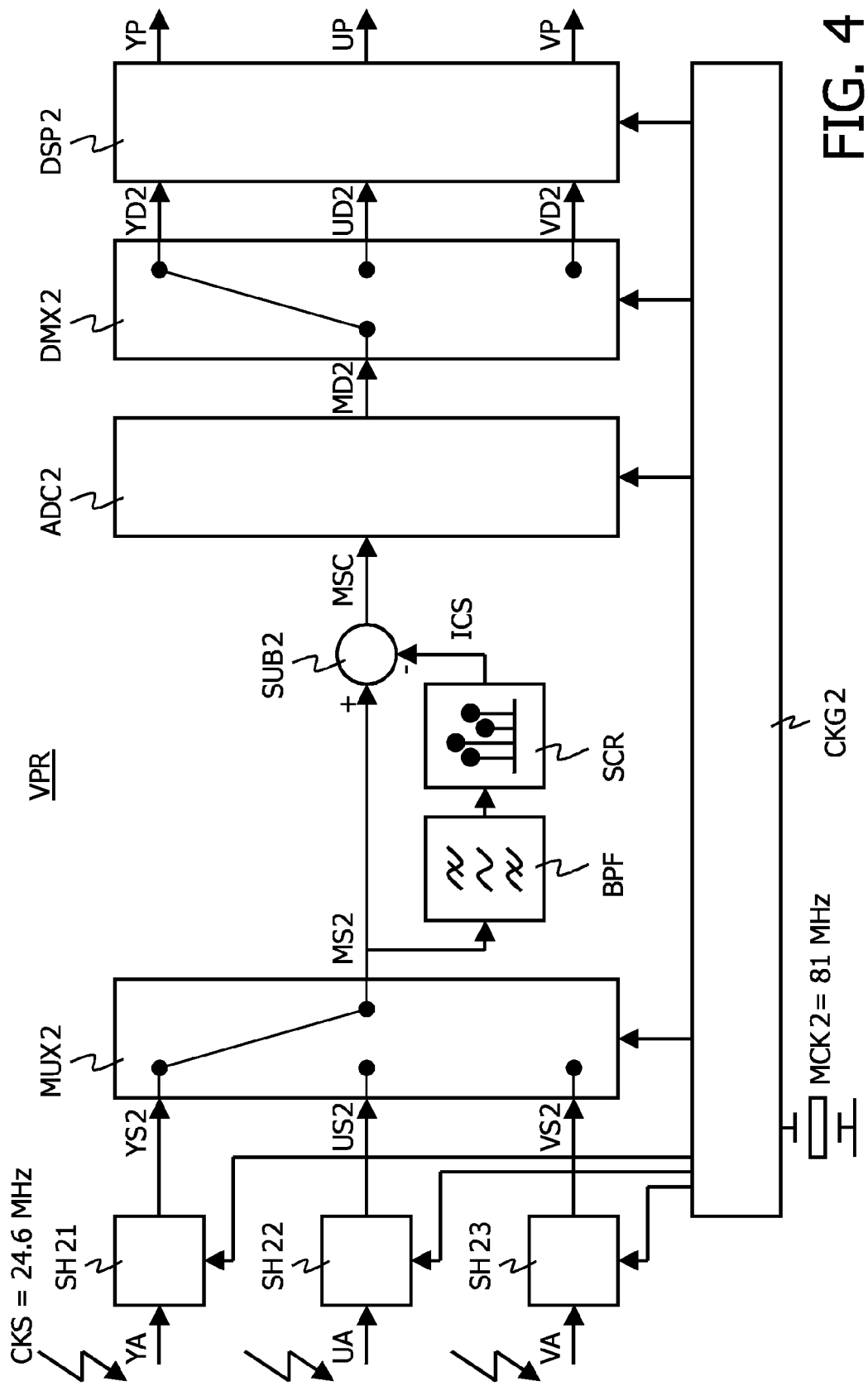
FIG. 4 is a block diagram that illustrates a second implementation of the video processor.

FIG. 4 illustrates a second implementation of the video processor, which will be referred to as second video processor implementation hereinafter. The second video processor implementation comprises three sample-and-hold circuits SH21, SH22, SH23, one for each of the analog video signals YA, UA, VA, respectively. The first video processor implementation further comprises a multiplexer MUX2, an analog-to-digital converter ADC2, a demultiplexer DMX2, a digital signal processor DSP2, and a clock generator CKG2. The second video processor implementation further comprises a band pass filter BPF, a sample corrector SCR, and a subtractor SUB2. The second video processor implementation may further comprise delay circuits, which are not shown, that compensate for any filter delays.

The second video processor implementation operates as follows. The three sample-and-hold circuits SH21, SH22, SH23 and the multiplexer MUX2 operate in a fashion that has been described hereinbefore with regard to sample-and-hold circuits SH11, SH12, SH13 and multiplexer MUX1, respectively. Accordingly, sample-and-hold circuit SH21 will produce a stream of analog luminance samples YS2 that comprises a folding component, which has a frequency of 2.4 MHz. Sample-and-hold circuits SH22 and SH23 will produce a stream of analog first chrominance samples US1 and a stream of analog second chrominance samples VS1, respectively, that each comprise a similar folding component. The respective folding components are phase shifted with respect to each other, which can be understood from the respective sampling operations that FIG. 3 illustrates.

The multiplexer MUX2 provides a stream of multiplexed analog samples MS2, which is a multiplex of the respective streams of analog samples YS2, US2, VS2 that the three sample-and-hold circuits SH21, SH22, SH23 provide. Let it be assumed that the three sample-and-hold circuits SH21, SH22, SH23 do not receive the analog video signals YA, UA, VA. Nonetheless, the three sample-and-hold circuits SH21, SH22, SH23 will each receive a parasitic signal, which is due to the crosstalk of the system clock signal CKS. Let it further be assumed that the respective parasitic signals are identical. The three sample-and-hold circuits SH21, SH22, SH23 receive the same parasitic signal.

In that case, the stream of multiplexed analog samples MS2, which multiplexer MUX2 provides, corresponds with a stream of analog samples that a sample-and-hold circuit having a sampling frequency of 81 MHz will provide in response to the same parasitic signal. In effect, as far as the parasitic signal is concerned, the three sample-and-hold circuits SH21, SH22, SH33 are functionally equivalent to a single sample-and-hold circuit that has a sampling frequency of 81 MHz.

The stream of multiplexed analog samples MS2 will not comprise any 2.4 MHz folding component if the three sample-and-hold circuits SH21, SH22, SH23 indeed receive exactly the same parasitic signal, which is an ideal case. In practice, there may be some difference between respective parasitic signals in the analog video signals YA, UA, VA. In that case, a 2.4 MHz folding component will be present in the stream of multiplexed analog samples MS2. However, this 2.4 MHz folding component will have a relatively small magnitude compared with the respective 2.4 MHz folding components in the respective streams of analog samples YS2, US2, VS2.

The stream of multiplexed analog samples MS2 will comprise a parasitic component, which has a frequency of 24.6 MHz. This 24.6 MHz parasitic component is at least partially a digital representation of the respective parasitic signals in the analog video signals YA, UA, VA, which are due to the crosstalk of the system clock signal CKS. There may be other spectral components in the vicinity of 24.6 MHz. The analog luminance signal YA, whose bandwidth ranges to 5 MHz, may comprise spectral components in the vicinity of 2.4 MHz. Sample-and-hold circuit SH21 folds these 2.4 MHz spectral components, as it were, so that these become 24.6 MHz spectral components in the stream of multiplexed analog samples MS2.

The band pass filter BPF filters the stream of multiplexed analog samples MS2 and applies a band pass filtered stream of multiplexed analog samples to the sample corrector SCR. The band pass filter BPF preferably has a relatively narrow pass band that is centered on 24.6 MHz. Such a narrow pass band prevents to a certain extent that spectral components, which originates from the analog luminance signal YA, pass the band pass filter BPF and reach the sample corrector SCR. The sample corrector SCR processes the band pass filtered stream of multiplexed analog samples so as to provide an interference compensating stream of samples ICS. Ideally, the interference compensating stream of samples ICS comprises only the parasitic 24.6 MHz component, which is due to the crosstalk of the system clock signal CKS. That is, the interference compensating stream of samples ICS should ideally not comprise any 24.6 MHz spectral component that originates from the analog luminance signal YA.

The subtractor SUB2 subtracts the interference compensating stream of samples ICS from the stream of multiplexed analog samples MS2. This compensates for the parasitic 24.6 MHz component, which is present in the stream of multiplexed analog samples MS2. Accordingly, the subtractor SUB2 provides an interference-compensated stream of multiplexed analog samples MSC that comprises a parasitic 24.6 MHz component whose magnitude is relatively small compared with the parasitic component in the stream of multiplexed analog samples MS2. Ideally, the interference-compensated stream of multiplexed analog samples MSC does not comprise any parasitic 24.6 MHz component.

The analog-to-digital converter ADC2 provides a stream of multiplexed digital samples MD2 in response to the interference-compensated stream of multiplexed analog samples MSC. The demultiplexer DMX2 splits the stream of multiplexed digital samples MD2 into a stream of digital luminance samples YD2, a stream of digital first chrominance samples UD2 and a stream of digital second chrominance samples VD2. The analog-to-digital converter ADC2 and the demultiplexer DMX2 operate in a fashion that has been described hereinbefore with regard to the analog-to-digital converter ADC1 and the demultiplexer DMX1, respectively, in the first video processor implementation.

The demultiplexer DMX2 can be regarded to constitute a decimator that has a decimation factor of 3. The demultiplexer DMX2 will introduce folding similar to such a decimator. Any parasitic 24.6 MHz component in the interference-compensated stream of multiplexed analog samples MSC will fold to become a parasitic 2.4 MHz component in the stream of digital luminance samples YD2. Such folding will also produce a parasitic 2.4 MHz component in the stream of digital first chrominance samples UD2 and in the stream of digital second chrominance samples VD2. As explained hereinbefore, the band pass filter BPF, the sample corrector SCR, and the subtractor SUB2 provide compensation for the parasitic 24.6 MHz component in the stream of multiplexed analog samples MS2. This compensation makes that the 24.6 MHz component in the interference-compensated stream of multiplexed analog samples MSC is relatively weak or even absent, which is the ideal case.

It has been mentioned hereinbefore that the interference compensating stream of samples ICS should ideally not comprise any 24.6 MHz spectral component that originates from the analog luminance signal YA. This can be understood as follows.

Let it be assumed that the band pass filter BPF, the sample corrector SCR and the subtractor SUB2 are replaced by a short circuit, which directly transfers the stream of multiplexed analog samples MS2 to the analog-to-digital converter ADC2. That is, there is no filtering between the multiplexer MUX2 and the analog-to-digital converter ADC2. As explained hereinbefore, a 2.4 MHz component in the analog luminance signal will produce a 24.6 MHz component in the stream of multiplexed analog samples. The demultiplexer DMX2 will fold the 24.6 MHz component back, as it were, to re-become a 2.4 MHz component in the stream of digital luminance samples YD2. Multiplexing and demultiplexing do not introduce any frequency distortion. These operations are transparent, as it were. It is as if each respective stream of analog samples YS2, US2, VS2 had its own analog-to-digital converter ADC2.

Let it now be assumed that the sample corrector SCR is replaced by a short circuit. In that case, the band pass filter BPF and the subtractor SUB2 constitute a so-called notch filter, which suppresses any spectral component in a frequency band centered on 24.6 MHz. Consequently, a 24.6 MHz component that originates from the analog luminance signal will be suppressed. The 24.6 MHz component will not reach the demultiplexer DMX2 and can therefore not produce the 2.4 MHz component in the stream of digital luminance samples YD2, which would otherwise have been present as in the case described hereinbefore. Consequently, suppression of the 24.6 MHz component, which originates from the analog luminance signal, will create a frequency distortion.

The sample corrector SCR can prevent the frequency distortion described hereinbefore to certain extent. The sample corrector SCR can make a better distinction between a parasitic 24.6 MHz component and a 24.6 MHz component that originates from the analog luminance signal. To that end, the sample corrector SCR uses the first chrominance samples and the second chrominance samples, which are present in the stream of multiplexed analog samples MS2. The first chrominance samples and the second chrominance samples comprise the parasitic 24.6 MHz component but not any component that originates from the analog luminance signal YA. The sample corrector SCR makes an estimation of the parasitic 24.6 MHz component on the basis of the first chrominance samples and the second chrominance samples. This estimation allows the sample corrector SCR to distinguish between the parasitic 24.6 MHz component and a 24.6 MHz component that originates from the analog luminance signal YA. Accordingly, the sample corrector SCR can prevent the latter 24.6 MHz component from being present in the interference compensating stream of samples ICS.

CONCLUDING REMARKS

The detailed description hereinbefore with reference to the drawings illustrates the following characteristics, which are cited in various independent claims. In a signal processor (VDD), a sampling arrangement (SH11, S12, SH13, ADC1 in FIG. 2; SH21, SH 22, SH23 in FIG. 4) samples at least a first signal (YA) and a second signal (UA, VA) so as to obtain sampled first signal (YD1 in FIG. 2; YS2 in FIG. 4) and a sampled second signal (UD1, VD1 in FIG. 2; US2, VS2 in FIG. 4), respectively. A folding compensator (LPF11, LPF12, LPF13, SUB11, SUB12, MUX12 in FIG. 2; BPF, SCR, SUB2 in FIG. 4) compensates for a folding component in the sampled first signal (YD1; YS2) on the basis of a spectral portion of the sampled second signal (UD1, VD1; US2, VS2) that is substantially free of components that originate from the second signal (UA, VA).

The detailed description hereinbefore further illustrates various optional characteristics, which are recited in the dependent claims and highlighted in the following paragraphs. These characteristics may be applied to advantage in combination with the aforementioned characteristics.

The sampling arrangement (SH11, S12, SH13, ADC1 in FIG. 2) comprises an analog-to-digital converter (ADC1). The folding compensator (LPF11, LPF12, LPF13, SUB11, SUB12, MUX12) receives the sampled first signal (YD1) and the sampled second signal (UD1, VD1) from the analog-to-digital converter (ADC1) in the form of respective streams of digital samples. This contributes to a good signal processing quality because the folding compensator will compensate for a folding component, which results from a parasitic signal that is introduced between a sampling operation and a magnitude quantization operation. As explained in the detailed description with reference to FIG. 2, there will be compensation for a crosstalk of the system clock signal CKS to a signal path between the three sample-and-hold circuits SH11, SH12, SH13 and the analog-to-digital converter ADC1. The sampling arrangement (SH11, S12, SH13, ADC1) comprises a plurality of sample-and-hold circuits (SH11, S12, SH13) that provide a first stream of analog samples (YS1) in response to the first signal (YA) and a second stream of analog samples (US1, VS1) in response to the second signal (UA, VA). A multiplexer (MUX11) forms a stream of multiplexed analog samples (MS1) that comprises analog samples from the first stream of analog samples (YS1) and from the second stream of analog samples (US1, VS1), and applies the stream of analog multiplexed samples (MS1) to the analog-to-digital converter (ADC1). A demultiplexer (DMX1) derives the sampled first signal (YD1) and the sampled second signal (UD1, VD1) from a stream of multiplexed digital samples (MD1) that the analog-to-digital converter (ADC1) provides in response to the stream of analog multiplexed samples (MS1). This further contributes to a good signal processing quality because the folding compensator can fully compensate for a folding component, which results from a parasitic signal introduced between the multiplexer and the analog-to-digital converter. The folding compensator (LPF11, LPF12, LPF13, SUB11, SUB12, MUX12) comprises a filter arrangement (LPF11, SUB11, LPF12, SUB12) for filtering the sampled second signal (UD1, VD1) so as to obtain folding-compensation samples (UIF, VIF). The filter arrangement (LPF11, SUB11, LPF12, SUB12) has a pass band in the spectral portion of the sampled second signal (UD1, VD1) that is substantially free of components that originate from the second signal (UA, VA). A combiner (MUX1) combines the sampled first signal (YD1) with the folding-compensation samples (UIF, VIF). This allows cost-efficient implementations.

In the aforementioned filter arrangement (LPF11, SUB11, LPF12, SUB12), a filter (LPF11, LPF12) filters the sampled second signal (UD1, VD1) so as to obtain a filtered and sampled second signal (UF, VF). The filter (LPF11, LPF12) has a pass band in a spectral portion of the sampled second signal (UD1, VD1) that substantially comprises components that originate from the second signal (UA, VA). A subtractor (SUB11, SUB12) subtracts the filtered and sampled second signal (UF, VF) from the sampled second signal (UD1, VD1) so as to obtain the folding-compensation samples (UIF, VIF). This further contributes to cost-efficient implementations because the filter carries out two functions: suppression of the folding component in the sampled second signal and extraction of the folding component from the sampled second signal for the purpose of compensation.

A clock generator (CKG1; CKG2) causes the sampling arrangement (SH11, S12, SH13, ADC1; SH21, SH 22, SH23) to alternately sample the first signal (YA) and the second signal (UA, VA) in different clock cycles of a common clock signal (MCK1; MCK2). This allows cost-efficient implementations.

A multiplexer (MUX2) combines the sampled first signal (YS2) and the sampled second signal (US2, VS2) so as to obtain a multiplexed signal (MS2). The folding compensator (BPF, SCR, SUB2) comprises a filter arrangement (BPF, SCR) that filters the multiplexed signal (MS2) so as to obtain folding-compensation samples (ICS). The filter arrangement (BPF, SCR) has a pass band within the spectral portion of the sampled second signal (US2, VS2) that is substantially free of components that originate from the second signal (UA, VA). A combiner (SUB2) combines the sampled first signal (YS2) with the folding-compensation samples (ICS). This constitutes an alternative implementation. FIG. 4 is an example of such an alternative implementation.

The filter arrangement (BPF, SCR) comprises a sample corrector (SCR), which prevents that the folding-compensation samples (ICS) comprise a component that originates from the sampled first signal (YS2). This contributes to good signal processing quality.

There is a frequency generator (XCO), which provides a frequency (24.6 MHz) that is susceptible to cause a folding component in the first signal (YA). The filter arrangement (BPF, SCR) comprises a filter (BPF) having a band pass characteristic with a center frequency that corresponds with the frequency (24.6 MHz) that the frequency generator (XCO) provides. This prevents that the frequency generator adversely affects signal processing quality.

The aforementioned characteristics can be implemented in numerous different manners. In order to illustrate this, some alternatives are briefly indicated.

The aforementioned characteristics may be applied to advantage in any type of signal processing. Video signal processing is merely an example. The aforementioned characteristics may equally be applied in, for example, signal processing in a cellular phone system, such as, for example, the cellular phone system known under the acronym GSM.

Folding compensation in accordance with the invention may be carried out with any arbitrary number of sampled signals. The detailed description merely provides an example in which there are three sampled signals. Folding compensation in accordance with the invention may equally be carried out with, for example, two or four sampled signals or any other number of sampled signals. Moreover, compensating for a folding component in one sampled signal need not necessarily be based on all the other sampled signals. This equally applies if signals are sampled with a different phase, as in the detailed description. The following example illustrates this. Let it be assumed that four different signals are sampled with respective sampling phases of 0, 90, 180, and 270 degrees. A combination of sampled signals having a 180 degrees sampling phase difference corresponds with a doubling of the effective sampling frequency. This can be sufficient to compensate for the folding component in one of these signals.

Folding compensation in accordance with the invention may be carried out at numerous different points in a signal processing chain. The following examples illustrate this. In the first video processor implementation, which FIG. 2 illustrates, a folding compensation is carried out in the digital sample domain, between the demultiplexer DMX1 and the digital signal processor DSP1. This folding compensation may be replaced by, for example, an equivalent folding compensation in the analog sample domain between the three sample-and-hold circuits SH11, SH12, SH13 and multiplexer MUX11. In the second video processor implementation, which FIG. 4 illustrates, a folding compensation is carried out in the analog sample domain, between the multiplexer MUX2 and the analog-to-digital converter ADC2. This folding compensation may be replaced by, for example, an equivalent folding compensation in the digital sample domain, between the analog-to-digital converter ADC2 and the demultiplexer DMX2. As explained hereinbefore, it is advantageous to carry out the folding compensation in the digital sample domain.

Folding compensation in accordance with the invention does not necessarily require a time-multiplexed analog-to-digital conversion. For example, referring to the first video processor implementation, which FIG. 2 illustrates, multiplexer MUX11, the analog-to-digital converter ADC1, and the demultiplexer DMX1 may be replaced by three separate analog-to-digital converters, one for each of the three respective streams of analog samples.

Folding compensation in accordance with the invention does not necessarily require a sampling arrangement that samples a plurality of signals one-by-one in a cyclic fashion. For example, the first video processor implementation, which FIG. 2 illustrates, may be modified as follows. The clock generator CKG1 may cause the three sample-and-hold circuits SH11, SH12, SH13 to sample the analog input signals YA, UA, VA at identical instants. Multiplexer MUX12 may be replaced by a circuit that makes a linear combination of respective digital samples associated with respective samples of the analog input signals YA, UA, VA, which have been taken at the same instant. Appropriate delay compensation may be provided, which accounts for respective delays in low pass filters LPF11, LPF12. It should further be noted that cyclic patterns other than the cyclic pattern that FIG. 3 illustrates, may be used. What is more, in a sampling cycle, several samples may be taken of a particular signal, whereas only when sample is taken from another signal. For example, referring to FIG. 2, two samples of the analog luminance signal YA may be taken in a sampling cycle, whereas only one sample is taken from the first chrominance signal UA and the second chrominance signal VA.

There are numerous ways of implementing functions by means of items of hardware or software, or both. In this respect, the drawings are diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function. The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:
1. A signal processor comprising:
   a sampling arrangement for sampling at least a first signal and a second signal so as to obtain a sampled first signal and a sampled second signal, respectively; and
   a folding compensator arranged to compensate for a folding component in the sampled first signal on the basis of spectral portion of the sampled second signal that is substantially free of components that originate from the second signal.

2. A signal processor according to claim 1, the sampling arrangement comprising an analog-to-digital converter, the folding compensator being coupled to receive the sampled first signal and the sampled second signal from the analog-to-digital converter in the form of respective streams of digital samples.

3. A signal processor according to claim 1 comprising:
a clock generator arranged to cause the sampling arrangement to alternately sample the first signal and the second signal in different clock cycles of a common clock signal.

4. An information-rendering system comprising a signal processor according to claim 1, and an information-rendering device for rendering an output signal that the signal processing arrangement provides.

5. A signal processor comprising:
a sampling arrangement for sampling at least a first signal and a second signal so as to obtain a sampled first signal and a sampled second signal, respectively; and
a folding compensator arranged to compensate for a folding component in the sampled first signal on the basis of spectral portion of the sampled second signal that is substantially free of components that originate from the second signal;
the sampling arrangement comprising:
an analog-to-digital converter, the folding compensator being coupled to receive the sampled first signal and the sampled second signal from the analog-to-digital converter in the form of respective streams of digital samples;
a plurality of sample-and-hold circuits arranged to provide a first stream of analog samples in response to the first signal and to provide a second stream of analog samples in response to the second signal;
a multiplexer arranged to form a stream of multiplexed analog samples that comprises analog samples from the first stream of analog samples and from the second stream of analog samples and to apply the stream of analog multiplexed samples to the analog-to-digital converter; and
a demultiplexer arranged to derive the sampled first signal and the sampled second signal from a stream of multiplexed digital samples that the analog-to-digital converter provides in response to the stream of analog multiplexed samples.

6. A signal processor comprising:
a sampling arrangement for sampling at least a first signal and a second signal so as to obtain a sampled first signal and a sampled second signal, respectively; and
a folding compensator arranged to compensate for a folding component in the sampled first signal on the basis of spectral portion of the sampled second signal that is substantially free of components that originate from the second signal;
the folding compensator comprising:
a filter arrangement for filtering the sampled second signal so as to obtain folding-compensation samples, the filter arrangement having a pass band in the spectral portion of the sampled second signal that is substantially free of components that originate from the second signal; and
a combiner for combining the sampled first signal with folding-compensation samples.

7. A signal processor according to claim 6, the filter arrangement comprising:
a filter for filtering the sampled second signal so as to obtain a sampled and filtered second signal, the filter having a pass band in a spectral portion of the sampled second signal that substantially comprises components that originate from the second signal; and
a subtractor for subtracting the sampled and filtered second signal from the sampled second signal so as to obtain the folding-compensation samples.

8. A signal processor according to claim 3 comprising:
a sampling arrangement for sampling at least a first signal and a second signal so as to obtain a sampled first signal and a sampled second signal, respectively;
a folding compensator arranged to compensate for a folding component in the sampled first signal on the basis of spectral portion of the sampled second signal that is substantially free of components that originate from the second signal;
a clock generator arranged to cause the sampling arrangement to alternately sample the first signal and the second signal in different clock cycles of a common clock signal; and
a multiplexer arranged to combine the sampled first signal and the sampled second signal so as to obtain a multiplexed signal,
the folding compensator comprising:
a filter arrangement for filtering the multiplexed signal so as to obtain folding-compensation samples, the filter arrangement having a pass band within the spectral portion of the sampled second signal that is substantially free of components that originate from the second signal; and
a combiner for combining the sampled first signal with folding-compensation samples.

9. A signal processor according to claim 8, the filter arrangement comprising a sample corrector for preventing that the folding-compensation samples comprise a component that originates from the sampled first signal.

10. A signal processor according to claim 8 comprising:
a frequency generator arranged to provide a frequency (24.6 MHz) that is susceptible to cause a folding component in the first signal, the filter arrangement comprising a filter having a band pass characteristic with a center frequency that corresponds with the frequency (24.6 MHz) that the frequency generator provides.

11. A method of signal processing comprising:
a sampling step in which at least a first signal and a second signal are sampled so as to obtain a sampled first signal and a sampled second signal respectively; and
a folding compensation step in which a folding component in the sampled first signal is compensated for on the basis of a spectral portion of the sampled second signal that is substantially free of components that originate from the second signal.

* * * * *